(12) United States Patent
Johnson et al.

(10) Patent No.: US 12,117,290 B2
(45) Date of Patent: Oct. 15, 2024

(54) METHOD FOR THE DETECTION OF CABLE SPACING IN GREEN TIRE

(71) Applicant: COMPAGNIE GENERALE DES ETABLISSEMENTS MICHELIN, Clermont-Ferrand (FR)

(72) Inventors: Ben Johnson, Campobello, SC (US); Gene Deamicis, Taylors, SC (US); Jake Pullara, Greenville, SC (US); Zoo Bear, Boiling Springs, SC (US)

(73) Assignee: Compagnie Generale des Etablissements Michelin, Clermont-Ferrand (FR)

( * ) Notice: Subject to any disclaimer, the term of this patent is extended or adjusted under 35 U.S.C. 154(b) by 191 days.

(21) Appl. No.: 17/995,603

(22) PCT Filed: Jun. 25, 2020

(86) PCT No.: PCT/US2020/039505
§ 371 (c)(1),
(2) Date: Oct. 6, 2022

(87) PCT Pub. No.: WO2021/262167
PCT Pub. Date: Dec. 30, 2021

(65) Prior Publication Data
US 2023/0152078 A1 May 18, 2023

(51) Int. Cl.
*G01B 7/14* (2006.01)
*G01M 17/02* (2006.01)
(Continued)

(52) U.S. Cl.
CPC .............. *G01B 7/14* (2013.01); *G01M 17/02* (2013.01); *G01R 33/0005* (2013.01); *G01R 33/072* (2013.01); *G01R 33/077* (2013.01)

(58) Field of Classification Search
CPC ........... G01B 7/14; G01B 7/15; G01M 17/02; G01N 27/83; G01N 2458/10;
(Continued)

(56) References Cited

U.S. PATENT DOCUMENTS 3,604,249 A * 9/1971 Wilson ................... G01N 29/12
73/660
6,005,388 A 12/1999 Kaefer-Hoffmann et al.
(Continued)

OTHER PUBLICATIONS

European Patent Office, International Search Report dated Feb. 19, 2021, pp. 1-14 (included), European Patent Office, Rijswijk, The Netherlands.

*Primary Examiner* — Vinh P Nguyen
(74) *Attorney, Agent, or Firm* — Neal P. Pierotti

(57) ABSTRACT

A method for use in the construction of tires is provided for sensing spacing between a plurality of radial cables in a tissue is provided. The method utilizes a probe that has a first magnet, a second magnet, a magnetic bridge, and a spacing hall effect sensor. The magnets are spaced from one another in a probe first length direction, and the spacing hall effect sensor is located between the magnets in the probe first length direction. The spacing hall effect sensor is located between the magnetic bridge and the cables in a probe second height direction when the probe is positioned next to the partially constructed tire. The probe is placed next to the partially constructed tire such that the first cable direction is not parallel to the probe first length direction. The probe is then used to sense spacing between successive ones of the cables.

15 Claims, 5 Drawing Sheets

(51) Int. Cl.
*G01R 33/00* (2006.01)
*G01R 33/07* (2006.01)

(58) Field of Classification Search
CPC ......... G01N 33/48721; G01N 33/5308; G01N 33/54306; G01R 33/0005; G01R 33/072; G01R 33/077; G01R 33/0354
See application file for complete search history.

(56) References Cited

U.S. PATENT DOCUMENTS

| | | | |
|---|---|---|---|
| 6,907,777 B2* | 6/2005 | Weiss | G01M 17/02 73/146 |
| 7,185,534 B2* | 3/2007 | Stoila | B29D 30/0061 73/146 |
| RE40,166 E | 3/2008 | Sukhorukov et al. | |
| 9,442,093 B2* | 9/2016 | Brandon | G01N 27/82 |
| 2007/0029027 A1 | 2/2007 | Stoila et al. | |
| 2012/0038357 A1 | 2/2012 | Brandon et al. | |
| 2012/0137761 A1 | 6/2012 | Dardelin et al. | |

\* cited by examiner

METHOD FOR THE DETECTION OF CABLE SPACING IN GREEN TIRE

CROSS-REFERENCE TO RELATED APPLICATIONS

The present application is a 35 U.S.C. § 371 application of PCT/US2020/039505 filed on Jun. 25, 2020 and entitled "Method for the Detection of Cable Spacing in Green Tire." PCT/US2020/039505 is incorporated by reference herein in its entirety for all purposes.

FIELD OF THE INVENTION

The present invention relates generally to a method for the detection of cable spacing in green tires. More particularly, the present application involves a method that includes a probe that utilizes a hall effect sensor and an angular arrangement relative to a direction of cables in tissue used in the construction of the tire to sense whether cables are too far apart form one another.

BACKGROUND

The construction of tires involves the assembly of a tire carcass onto a drum. This includes wrapping various tissue, some being metallic tissue, around the cylindrical drum to build the assembly up to a green tire. During this build process the partially constructed tire could be uninflated or partially inflated. Other elements such as metallic beads are incorporated into the partially constructed tire. Once the green tire is constructed it is placed into a mold for curing in which it is subjected to sufficient heat and pressure for a time long enough to vulcanize the green tire into a final cured tire. Subsequent processing steps may be employed to take the now cured tire to a final product. In the green tire building stage, certain tissue having metallic cables, sometime referred to as chords, are wrapped around the products or drum and abutted to itself. The metal cables run in the axial direction of the drum during the build process. These metallic cables make up what are known as the radial cables of the tire. These radial cables can be hand checked to make sure the abutment is proper and to ensure that excessive spacing is not present between the cables at this location or at any other location within the metallic tissue. The checking process may be executed by an operator with a steel ruler to measure spacing between the metal cables to ensure that excessive spacing between these metal cables is not present. However, this hand validation takes place after additional tissue is placed onto the metallic tissue including the radial cables, and the radial cables may not be clearly seen and thus not clearly measured by the inspector. After curing, X-ray evaluation of the tire is conducted and if an open joint were missed by the evaluation the now cured tire will be thrown out thus wasting time, money and product.

Additional means of evaluating metallic cables in tires are known. Some of these systems use X ray devices that employ high-resolution magnetic field sensors that view the inside of the rubber. However, such systems evaluate the belt package of the tire and cannot measure the radial cables of the tire that extend generally from bead to bead along the axial length of the tire. Other systems utilize a sensor and software package that scans green tires to provide a topography of the tire at different stages of the production process. Although capable of telling an operator what the tire looks like, such systems are not able to use magnetic flux evaluation to determine spacing issues with radial cables of uncured tires before the curing stage. As such, there remains room for variation and improvement within the art.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended FIGS. in which.

Figure 1:
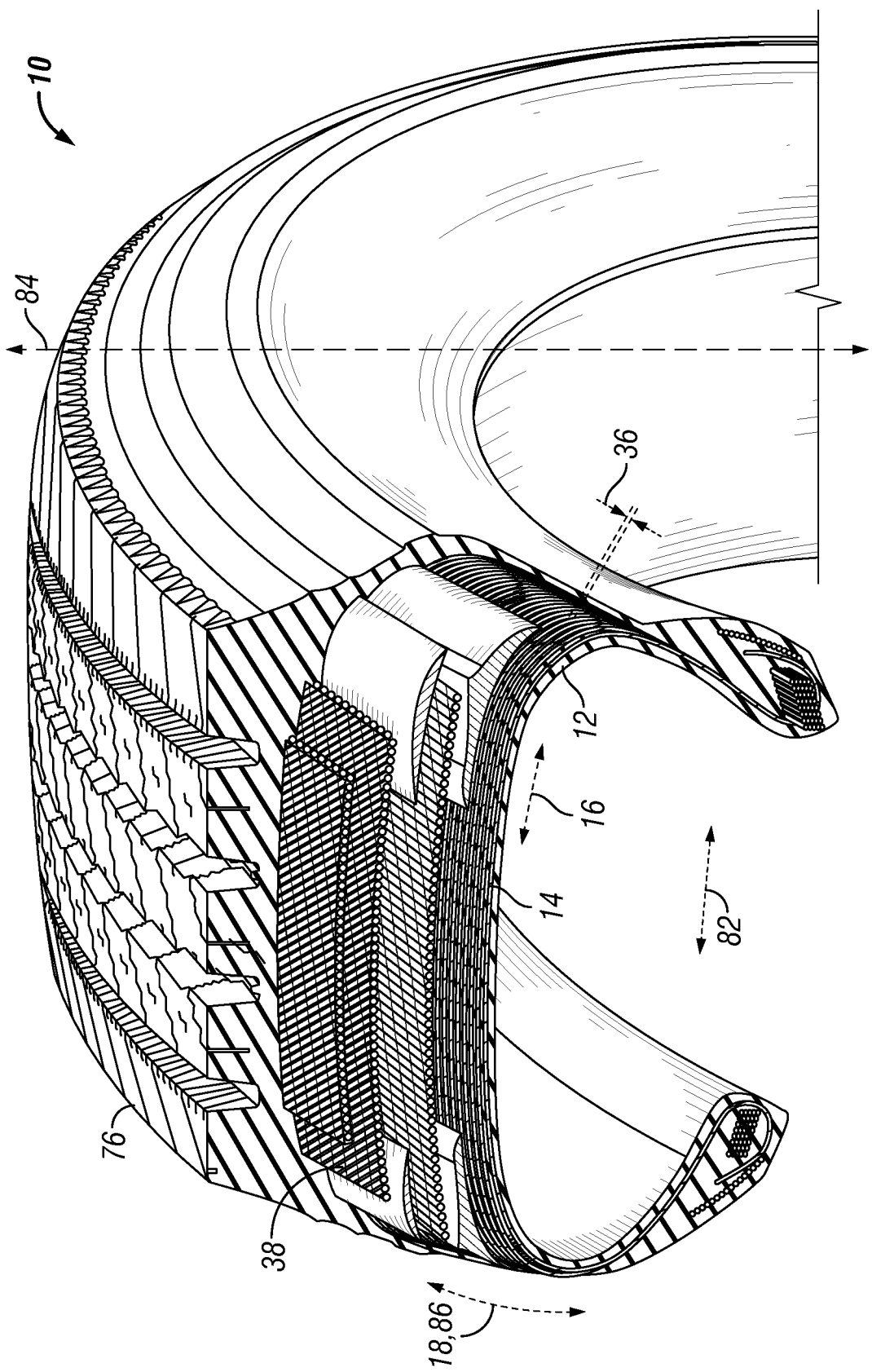
FIG. 1 is a perspective view of a tire with portions cut away so that interior features of the tire can be seen.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

The present invention provides for a method of detecting excessive spacing 78 of radial cables 14 in a partially constructed tire 10. The cables 14 are in a tissue 12 used to construct the tire 10, and the spacing is detected when the partially constructed tire 10 is uncured as opposed to being cured. The method includes placing a probe 20 that has magnets 22, 24, a magnetic bridge 26, and a spacing hall effect sensor 28 proximate to the partially constructed tire 10. The probe 10 is oriented relative to the cables 14 so that a probe first length direction 30 is not parallel to a first cable direction 16. This orientation causes the probe 10 to be angled relative to the cables 14 so that an orientation angle 40 is established between these two elements. This orientation angle 40 enables the spacing hall effect sensor 28 to better detect a magnetic flux signature produced by excessive spacing 78 between successive cables 14 of the tissue 12. In this regard, the probe 20 can detect the excessive spacing 78 between the successive cable 14 and the tire 10 can be repaired before the tire 10 is cured. Additional embodiments include the incorporation of a damaged wire hall effect sensor 44 into the probe 20 so that the probe 20 can execute additional measurements on the tissue 12 such as the detection of broken cables 46 and damaged cables 48.

The production of a tire 10 involves assembling different types/sizes of rubber products, known as tissues 12, with other components made of different chemical and metal materials. Some of these tissues 12 include cables 14 that can be made of nylon or metal. The various products are wrapped around one another on a drum 80 ultimately resulting in the formation of a green tire 10. This green tire 10 is then placed into a mold where heat and pressure are applied to the green tire 10 in order cure it to form a cured tire 10. This cured tire 10 can then be subsequently processed to form the final completed tire 10. FIG. 1 shows a finished, cured tire 10 with portions cut away to illustrate interior features of the tire 10. The tire 10 includes a carcass that has a sidewall onto which tread 76 is positioned. The tread 76 can be variously shaped and can include a series of grooves, blocks, sipes, and other architectural features. The tread 76 is disposed on the crown portion of the carcass and is adjacent the sidewall of the tire 10. The crown portion of the tire 10 may be known as the summit and includes a belt package 38 with belts that could run in the circumferential direction 86 or at an angle to the circumferential direction 86. Three layers of belts in the belt package 38 are shown, but it is to be understood that any number of layers may be present in other embodiments. Layers below the belt package 38 in the radial direction 84 include the radial cables 14 that extend between the beads in the tire 10, and these radial cables 14 have a portion that run in the radial direction 84 and the axial direction 82. The first cable direction 16 is the direction the cables 14 run from bead to bead. The radial cables 14 are spaced 36 from one another in the circumferential direction 86, which is denoted in FIG. 1 as the second cable direction 18. The spacing 36 in the second cable direction 18 should all be the same for the successive cables 14, and the cables 14 should not touch one another so that successive cables 14 are not touching. The probe 20 that is used to sense spacing is configured for sensing the spacing of the radial cables 14 of the tire 10, and is not used for the sensing of the spacing of the cables of the belt package 38. As such, the probe 20 relates to the radial cables 14 and not the belt package 38 cables.

Figure 2:
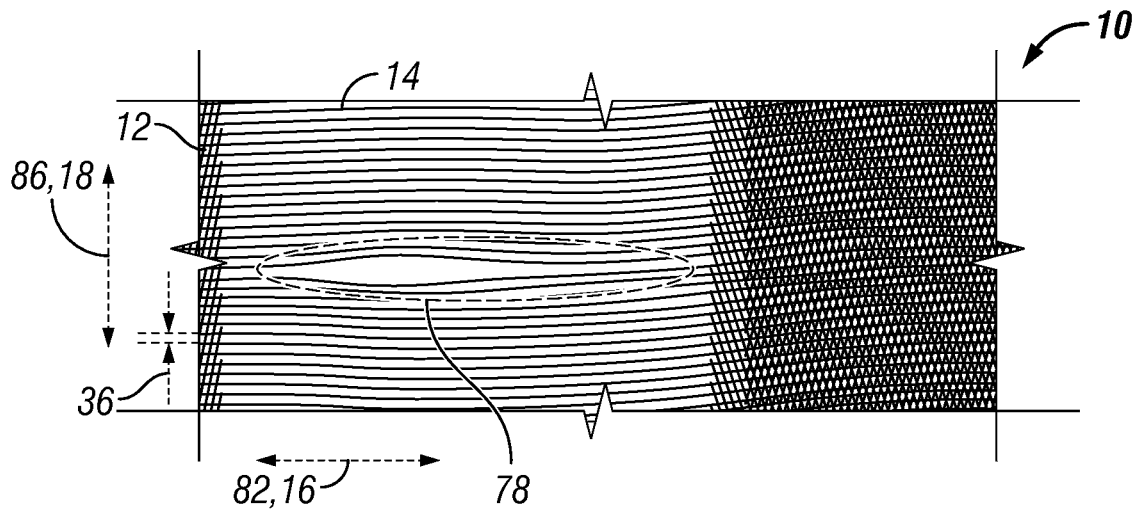
FIG. 2 is a plan view of a portion of the tire that shows excessive spacing between successive radial cables.

FIG. 2 shows a portion of the tire 10 that includes the tissue 12 that has the radial cables 14. The radial cables 14 in the tissue 12 are shown as extending in the axial direction 82, and are spaced from one another in the circumferential direction 86. The first cable direction 16 is the same as the axial direction 82 in the figure, and the second cable direction 18 is the same as the circumferential direction 86 in the figure. The spacing 36 is the distances in the second cable direction 18, circumferential direction 86, between successive cables 14 in the tissue 12. The successive cables 14 should not touch one another but should instead be spaced from one another and not touching. For desired construction of the tire 10, the spacing 36 should not be excessive between the successive cables 14, but should fall within a desired tolerance range. The tissue 12 in FIG. 2 has an excessive spacing 78 defect in that two of the cables 14 as illustrated are spaced from one another in the second cable direction 18 an amount greater than the desired tolerance range. This excessive spacing 78 is identified by the probe 20 so that the tire 10 can be repaired before it is cured and would potentially be scrapped. In some embodiments, the maximum spacing 36 is 2 millimeters if the design spacing is 1.5 millimeters so that any spacing 2 millimeters or over is excessive spacing 78. In other embodiments, if the spacing is designed to be 2.2 millimeters then any spacing 4.5 millimeters or greater would be classified as excessive spacing 78. In the embodiment shown in FIG. 2, the excessive spacing 78 is 3 millimeters, but it is to be understood that various amounts may be classified as excessive spacing 78 in accordance with different exemplary embodiments.

Figure 3:
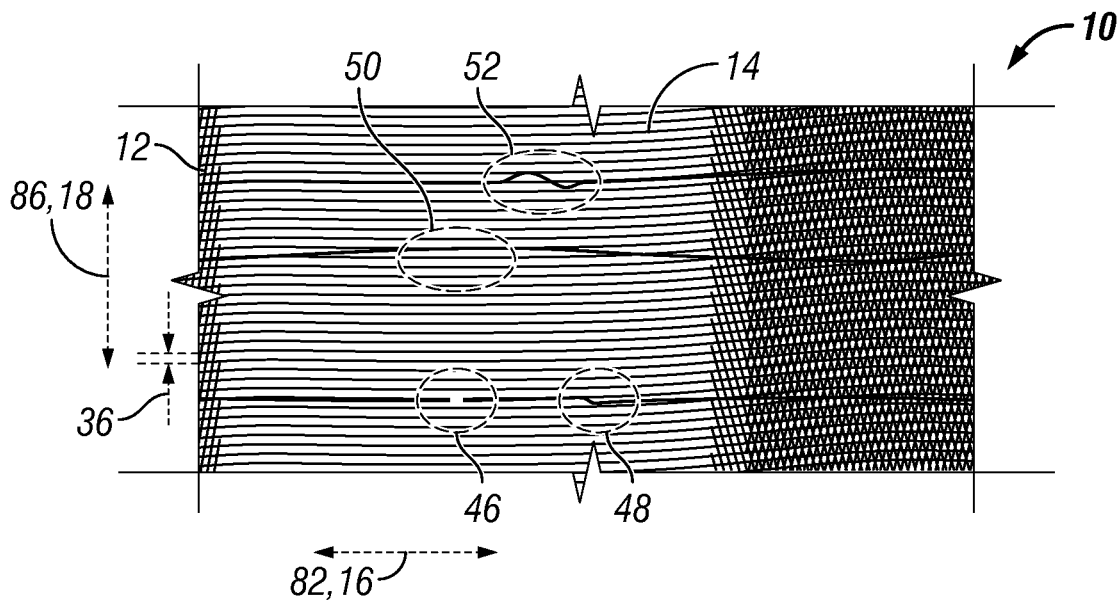
FIG. 3 is a plan view of a portion of the tire that shows touching radial cables, broken radial cables, damaged radial cables, and crossed radial cables.

FIG. 3 shows a portion of the tire 10 that includes tissue 12 with radial cables 14 that again have a first cable direction 16 that extends in the axial direction 82, and a second cable direction 18 that extends in the circumferential direction 86. The partially constructed tire 10 includes multiple defects in the arrangement of the radial cables 14. A broken cable 46 is shown in which the cable 14 is discontinuous in extension in the first cable direction 16. A damaged cable 48 is also identified in which the cable 14 is compressed or otherwise distorted or damaged. The damaged cable 48 may be a corroded cable. The damaged cable 48 may be the same cable 14 as the broken cable 46 or could be a different one of the cables 14 of the plurality of radial cables 14. Another defect shown in FIG. 3 are touching cables 50 in which two or more successive cables 14 in the second cable direction 18 engage one another. A still further defect identified in FIG. 3 is a crossing cable 52 in which one of the cables 14 crosses over another one or ones of the cables 14 resulting in a tissue 12 that is not properly constructed. The various defects 46, 48, 50, 52 may or may not be identified by the probe 20 in certain exemplary embodiments. In addition some but not all of the various defects 46, 48, 50, 52 may be identified by the probe 20 in some embodiments. The various deficiencies including the broken cable 46, damaged cable 48, touching cable 50, and crossing cable 52 can be different defects than the excessive spacing 78 defect of FIG. 2, and in some embodiments it is to be understood that the probe 20 only detects the excessive spacing 78 defect and not any of the other defects 46, 48, 50, 52.

Figure 4:
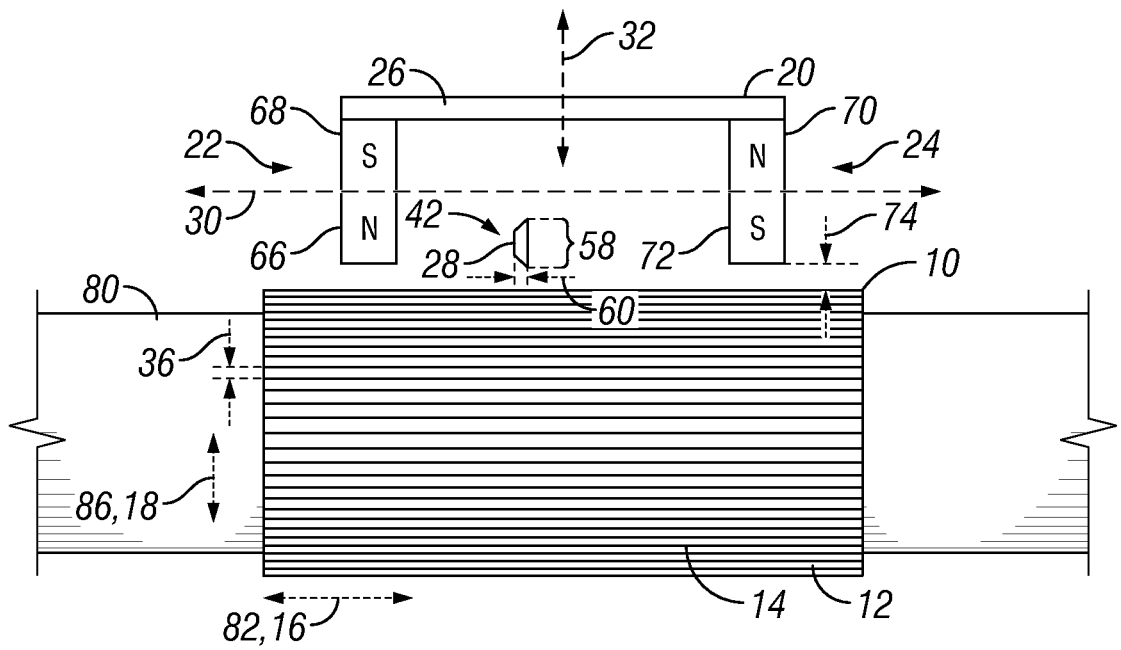
FIG. 4 is a side view of a partially constructed tire on a drum with a probe positioned next to the tire.

An embodiment of the probe 20 is shown with reference to FIG. 4. The probe 20 has a first magnet 22 and a second magnet 24 that are separated from one another in a probe first length direction 30 of the probe 20. The probe first length direction 30 is a straight line that extends through both the first magnet 22 and the second magnet 24, and may in some configurations of the probe 20 be along the length of the probe 20 that is the longest side of the probe 20. In other embodiments, the probe first length direction 30 is not the side of the probe 20 that is longest. The first magnet 22 and second magnet 24 are not touching one another in the embodiment shown. The first magnet 22 has a north pole 66 and a south pole 68 in which the north pole 66 is closer to the tissue 14 than the south pole 68. The second magnet 24 also has a north pole 70 and south pole 72, but the south pole 72 is closer to the tissue 14 than the north pole 70. The magnets 22, 24 may be permanent magnets. A magnetic bridge 26 can extend between the magnets 22, 24 in the probe first length direction 30 and can engage both of the magnets 22, 24. The magnetic bridge 26 may be located farther from the tissue 12 than the magnets 22, 24. In this regard, the probe 20 has a probe second height direction 32 that is perpendicular to the probe first length direction 30 and represents the distance that is closer to or farther from the tissue 12. The magnetic bridge 26 is thus farther from the tissue 12 in the probe second height direction 32 than the magnets 22, 24. The magnetic bridge 26 may be made of steel and is magnetically conductive so as to help keep the magnetic lines of flux from the magnets 22, 24 closer to the tested tissue 12 for measurement. If not present, the magnetic flux lines may move further outward in the probe second height direction 32 to result in a much weaker magnet flux field for measurement. The magnetic bridge 26 can be made of steel. The magnetic bridge 26 thus introduces as near a saturation of magnetic flux as is possible in the inspection material between the poles of the magnetic bridge26.

Another element of the probe 20 is a spacing hall effect sensor 28 that is located between the magnets 22, 24 in the probe first length direction 30. The spacing hall effect sensor 28 is positioned relative to the magnetic bridge 26 so that the spacing hall effect sensor 28 is closer to the tissue 12 in the probe second height direction 32 than the magnetic bridge 26. The spacing hall effect sensor 28 is arranged in a vertical orientation 42 in the probe 20. The spacing hall effect sensor 28 may have sides that have different amounts of surface area. One of the sides may have a greater surface area 58 and one of the sides may have a lesser surface area 60. The lesser surface area 60 is positioned closer to and facing the tissue 12, and the greater surface area 58 has a portion farther from the tissue 12 than the lesser surface area 60 in the probe second height direction 32. If it's the case that the spacing hall effect sensor 28 does not have rectangular sides, then the lesser surface area 60 may be one of the sides that is smaller in surface area than the greater surface area 58 even though these two sides 58, 60 need not have the smallest and greatest surface area respectively.

The building of the tire 10 includes wrapping various pieces around the drum 80 and building them on one another until a green tire 10 is constructed for subsequent curing. The partially build tire 10 can be non-inflated, partially inflated, or fully inflated during different portions of its construction on the drum 80. The tissue 12, that may include rubber, can be wrapped around the drum 80 or components all ready on the drum 80 and its ends may be abutted. This tissue 12 includes the radial cables 14, and the radial cables 14 are arranged in a parallel direction to the axis about which the drum 80 rotates. The probe 20 is positioned next to the tissue 12 that has the cables 14, and is distanced a space 74 from the tissues 12/cables 14 in the probe second height direction 32. The space 74 can be 3 millimeters in one embodiment, but it is to be understood that the space 74 can be other distances than 3 millimeters in other embodiments. The space 74 may be measured as the closest approach of the probe 20 to the tissue 12 in the probe second height direction 32. This closest point may be the first magnet 22, the second magnet 24, the spacing hall effect sensor 28, or any combination of these components. The probe 20 can be spaced from the tissue 12/cables 14 so that it does not engage the tissues 12/cables 14 during the measuring process. The probe 20 may thus directly face the tissue 12 during measurement. In other embodiments, there can be one or more tissues or products placed upon the tissue 12 that has the cables 14 so that the probe does not directly face the tissue 12 with the cables 14. The probe 20 may in these manners still measure the cables 14 but will do so with other tissues or products between it and the cables 14 in the probe second height direction 32.

The probe 20 can measure the partially built tire 10 when the partially built tire 10 is in a confirmation stage of building. Here, the partially built tire 10 may somewhat take the shape of the final form of the tire 10, and may or may not have some degree of inflation imparted thereon during the measurement. The measurement may take place before the summit package which includes the belt package 38 is placed onto the tissues of the carcass. However, the present measurement with the probe 20 could in fact be done downstream from this point and thus the excessive spacing 78 and/or cable properties 46, 48, 50 and/or 52 could be identified with the belt package 38 or other tissues on and over the tissue 12 so long as the partially constructed tire 10 has not yet been cured.

Figure 5:
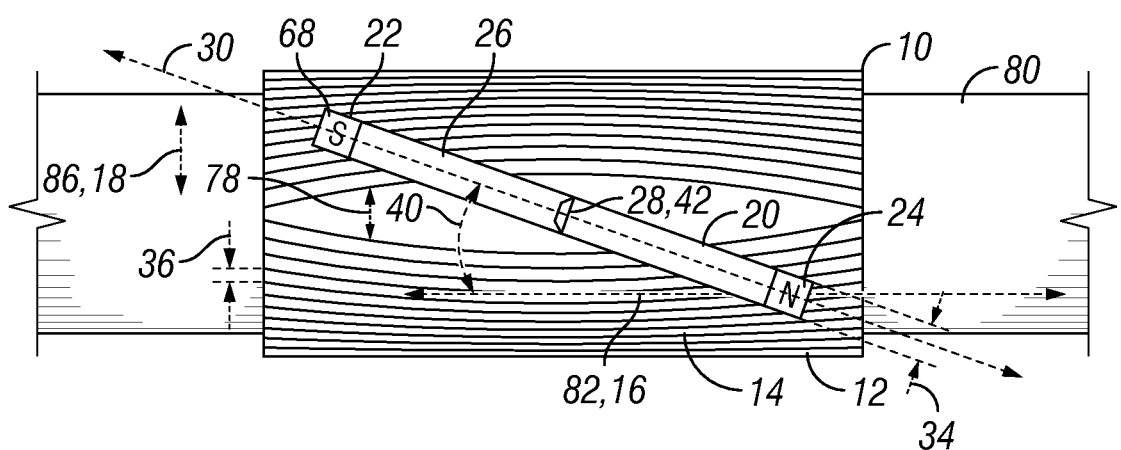
FIG. 5 is a top view of the probe and the partially constructed tire on the drum of claim 4.

The probe 20 and drum 80 of FIG. 4 are shown in top view in FIG. 5. The probe 20 has a probe third width direction 34 that is parallel to both the probe first length direction 30 and the probe second height direction 32. The probe 20 is shortest in the probe third width direction 34 as compared to the other two directions 30 and 32. The probe 20 is arranged at an angle relative to the cables 14. In this regard, the first cable direction 16 extends in the same direction as the axial direction 82 of the partially constructed tire 10 which is also in the same direction as the axis about which the drum 80 rotates. The first cable direction 16 is the desired direction of the cables 14 such that cables 14 are designed to run in this direction. The probe 20 has the probe first length direction 30 as discussed which is the direction extending through both the magnets 22, 24 and in this case also the spacing hall effect sensor 28. The probe first length direction 30 also represents the longest side of the probe 20 in this embodiment but it need not in other embodiments. The probe first length direction 30 is not parallel to the first cable direction 16. Instead, an orientation angle 40 is established between the probe first length direction 30 and the first cable direction 16 (and here also the axial direction 82 and the direction of the axis of the drum 80). The orientation angle 40 can be from 10-55 degrees, from 10-45 degrees, from 10-35 degrees, from 10-25 degrees, from 20-30 degrees, from 30-45 degrees, from 2-10 degrees, from 5-65 degrees, or from 15-25 degrees. In a preferred embodiment, the orientation angle 40 is 20 degrees. It is therefore the case that the probe 20 is arranged at an angle to the cables 14 and the probe 20 is not set up so as to be parallel to the extension direction of the cables 14 in the tissue 12.

The cables 14 are not properly constructed and excessive spacing 78 is shown in FIG. 5 in which the excessive spacing 78 is greater than other spacing 36 of the cables 14 in the second cable direction 18 and is greater than an approved tolerance for maximum spacing of the cables 14 in the second cable direction 18. The probe 20 is shown as being above the excessive spacing 78, and the orientation of the probe 20 causes portions of the probe 20 to be on opposite sides of the excessive spacing 78 in the second cable direction 18. The drum 80 can be rotated 360 degrees, thus rotated in the circumferential direction 86/second cable direction 18, so that all of the cables 14 are run past the probe 20 to measure all the spacing 36. In other embodiments, the probe 20 may instead move around the cables 14 and drum 80 360 degrees and while the cables 14 and drum 80 remain stationary.

Figure 6:
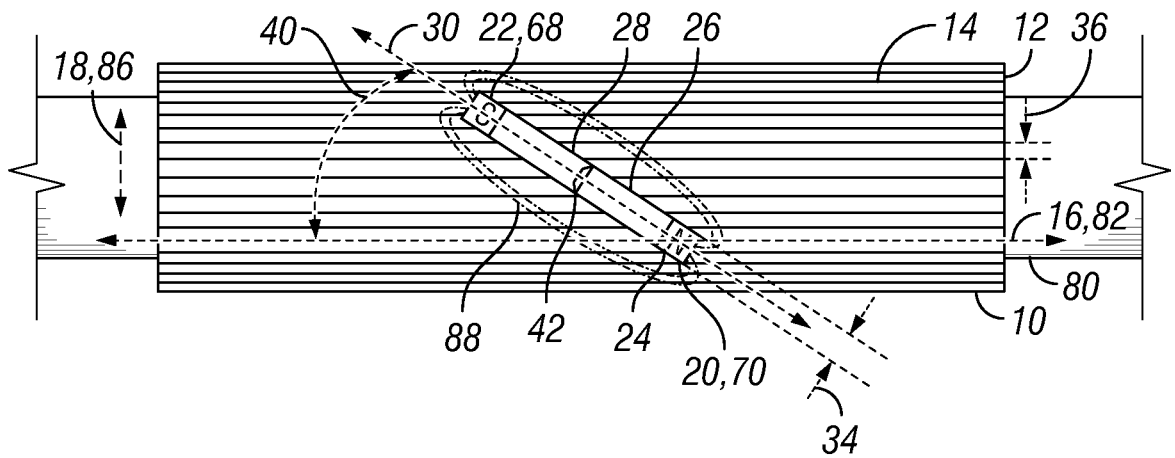
FIG. 6 is a top view of the probe positioned next to the partially constructed tire showing magnetic flux lines in response to cables that are not excessively spaced.

FIG. 6 shows a top view of the probe 20 positioned next to the cables 14 of the tissue 12 as the partially constructed tire 10 is built upon the drum 80. The probe 20 is again angled relative to the cables 14 and drum 80. The magnets 22, 24 create flux lines 88 that go through the cables 14 and the magnetic bridge 26 as they are contained by the magnetic bridge 26. The cables 14 are all properly aligned in FIG. 6 with respect to spacing 36 so that no excessive spacing 78 exists. The flux lines 88 generated by the magnets 22, 24 are sized and spaced in a certain way via the aligned cables 14 and the magnetic bridge 26. The spacing hall effect sensor 28 will sense the flux lines 88 and generate an electrical signal indicative of these particular flux lines 88. The signal from the spacing hall effect sensor 28 will be sent to a processor where it will be processed to inform the system or operator that the cables 14 are appropriately spaced 36 in the second cable direction 18. The processor may include or be part of an appropriate electronic circuit capable of receiving output from the sensors 28, 44 of the probe 20 and converting this to output indicative of the sensed conditions.

Figure 7:
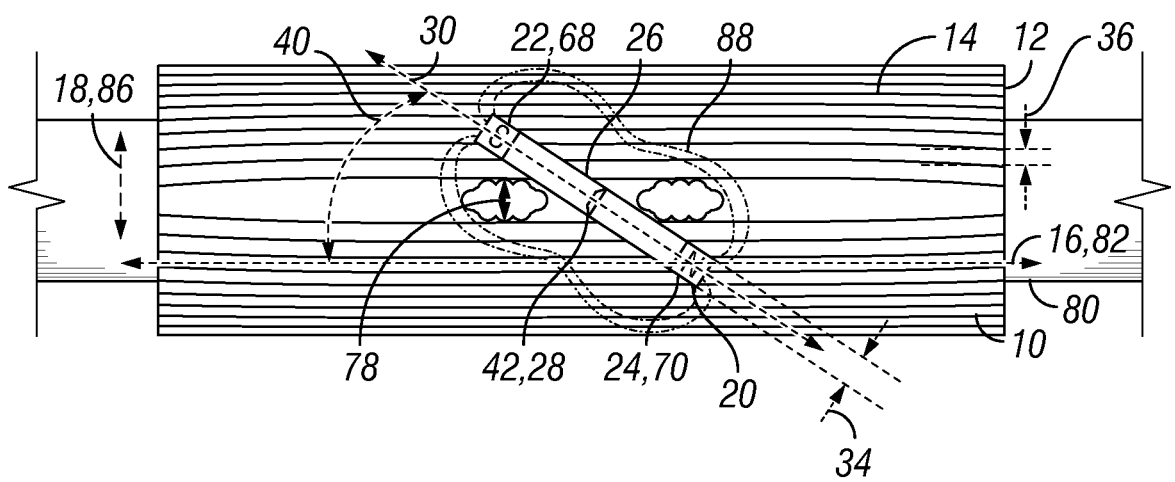
FIG. 7 is a tip view of the probe positioned next to the partially constructed tire showing magnetic flux lines in response to cables that are excessively spaced from one another.

FIG. 7 is an embodiment set up the same way as in FIG. 6, but in which two of the cables 14 are not properly spaced from one another resulting in an excessive spacing 78 between these two cables 14. The probe 20 will detect this excessive spacing 78 by detecting flux leakage in the flux lines 88 caused by the excessive spacing 78. As shown, the flux lines 88 generated by the magnets 22, 24, and contained by the magnetic bridge 26, and effected by the cables 14 in a different way because of the excessive spacing 78. There will be a flux leakage of the flux lines 88 into this excessive spacing 78 so that the flux lines 88 as measured by the spacing hall effect sensor 28 will be different than that as measured in the FIG. 6 arrangement. The excessive spacing 78 distorts the flux lines 88, and this distortion is measured by the spacing hall effect sensor and an electrical signal is sent to the processing equipment to provide notification that excessive spacing 78 of the cables 14 is present. The excessive spacing 78 causes a flux plumage and thus causes the flux lines 88 to be deflected away from the spacing hall effect sensor 28. The tire 10 may then be repaired before it is cured and would otherwise need to be scrapped. The orientation angle 40, preferably at 20 degrees, allows for the detection of the excessive spacing 78 as at an orientation angle 40 the flux leakage into the excessive spacing 78 can be detected by the spacing hall effect sensor 28 as opposed to other arrangements in which this excessive spacing 78 cannot be so detected because the corresponding flux leakage into the excessive spacing 78 cannot be created.

Figure 8:
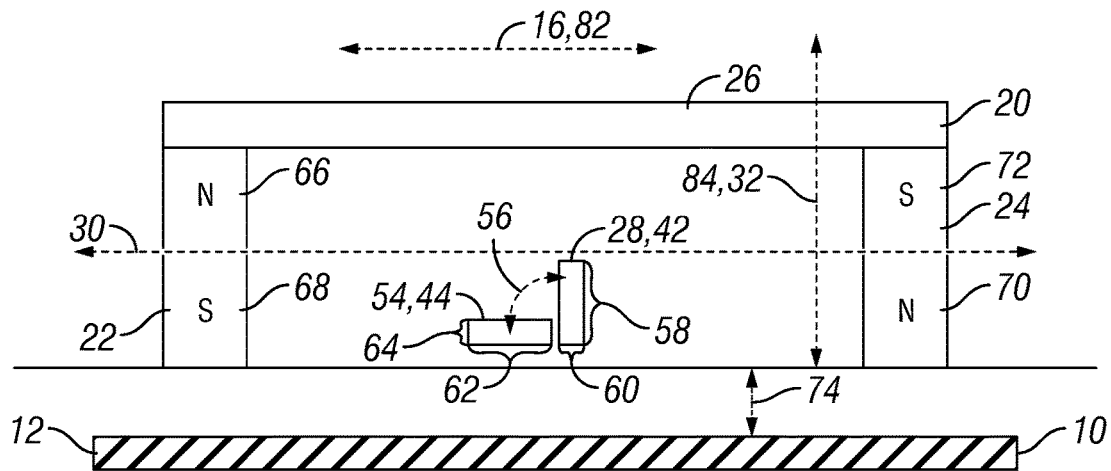
FIG. 8 is a side view of the probe positioned next to the partially constructed tire in which the probe includes both a spacing hall effect sensor and a damaged wire hall effect sensor.

The probe 20 may be provided so that it can detect not only excessive spacing 78, but also the other damage conditions 46, 48, 50, 52 as previously discussed. FIG. 8 shows an exemplary embodiment of the probe 20 arranged in a similar manner to those previously discussed, but also including a damaged wire hall effect sensor 44. The damaged wire hall effect sensor 44 is oriented in a different manner than the spacing hall effect sensor 28. In this regard, the two sensors 28, 44 are arranged at an angle 56 to one another. This angle 56 may be 90 degrees in some exemplary embodiments. The damaged wire hall effect sensor 44 is arranged in a horizontal orientation 54. The damaged wire hall effect sensor 44 has surfaces that have a greater surface area 62 and a lesser surface area 64. The greater surface area 62 has a greater surface area than the lesser surface area 64. The greater surface area 62 surface is closer to the tissue 12 and cables 14 being measured than the lesser surface area 64. In this regard, some portion of the lesser surface area 64 is farther from the tissue 12 and cables 14 than all of the greater surface area 62 in the probe second height direction 32. If the damaged wire hall effect sensor 44 does not have all rectangular surfaces, the surface area of the surface directly facing the tissue 12/cables 14 is a greater surface area 62 than the lesser surface area 64 surface not directly facing and having portions farther from in the probe second height direction 32. The two sensors 28, 44 are arranged relative to one another so that one is in the vertical orientation 42 and the other in the horizontal orientation 54 such that a larger surface of one faces the tissue 12 and a smaller surface of the other faces the tissue 12. The damaged wire hall effect sensor 44 is located between the magnets 22, 24 in the probe first length direction 30, and is closer to the tissue 12 in the probe second height direction 32 than the magnetic bridge 26. The damaged wire hall effect sensor 44 can be the portion of the probe 20 that is closest to the tissue 12 in the probe second height direction 32, or may be farther from or the same distance from the tissue 12 in this direction 32 as other parts of the probe 20 such as the magnets 22, 24 and the spacing hall effect sensor 28.

The angle 56 can be the angle from the greater surface area 58 of the spacing hall effect sensor 28 to the greater surface area 62 of the damaged wire hall effect sensor 44. The angle of 56 being 90 degrees is the optimal angle for detection. Although shown as being 90 degrees, this angle 56 can be any other angle in accordance with other embodiments. In some embodiments, the angle 56 is 10 degrees, from 10-25 degrees, from 25-35 degrees, from 35-55 degrees, from 55-90 degrees, from 90-120 degrees, or up to 170 degrees. As such, although other angles are possible, an angle 56 of 90 degrees is preferred.

Figure 9:
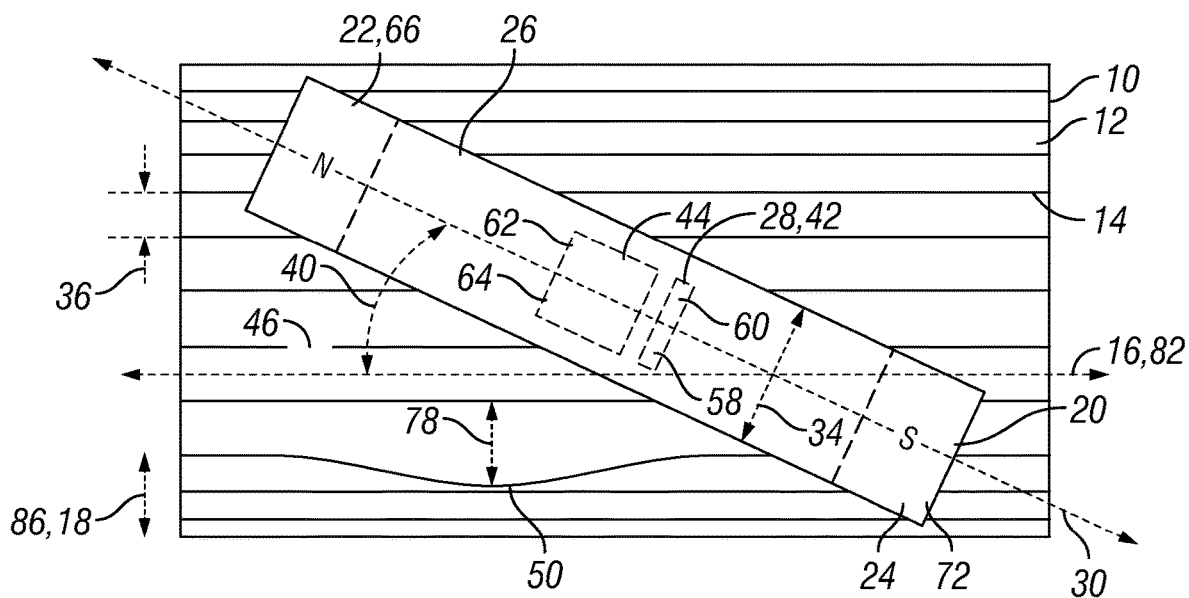
FIG. 9 is a top view of the probe of FIG. 8 positioned next to a partially constructed tire that has cables with excessive spacing, and a cable that is broken.

FIG. 9 is a top view of the probe 20 of FIG. 8 as positioned over cable 14 for evaluation. The probe 20 is again angled relative to the tissue 12 so that an orientation angle 40 is present that could be 20 degrees in some embodiments. The magnets 22, 24 will generate flux lines 88 as previously discussed and the flux leakage into the excessive spacing 78 can be detected by the spacing hall effect sensor 28 and reported by the probe 20 so that the excessive pacing 78 can be identified. The cables 14 also feature a broken cable 46 and touching cable 50. The broken cable 46 will create a variation in the flux lines 88 at this location. Similarly, the touching cable 50 will create a variation in the flux lines 88 at the location of touching. The variations in the flux lines 88 will be sensed by the damaged wire hall effect sensor 44 and electrical signals indicative of the broken cable 46 and touching cable 50 will be transmitted by the damaged wire hall effect sensor 44 from the probe 20 to processing equipment that will interpret the signals and inform the system that this broken cable 46 and touching cable 50 are present. The probe 20 may thus be used to identify the excessive spacing 78 in addition to none or any combination of cable anomalies 46, 48, 50, 52. If these anomalies 46, 48, 50, 52 are detected the pre-cured tire 10 could be repaired or scrapped as desired.

Although shown and described as employing only a single spacing hall effect sensor 28 and a single damaged wire hall effect sensor 44, it is to be understood that other embodiments are possible in which a plurality of sensors 28 and/or 44 are present in the probe 20 for detection of the damage conditions 78, 46, 48, 50, and/or 52. Further, although described as cables or radial cables 14, it is also known in the industry to call these elements radial cords, and it is to be understood that the term cables also includes cords. The static magnetic field created by the magnets 22, 24 is evaluated by different angle of attack placements of the hall effect sensors 28, 44 due to the orientation angle 40. The disclosed arrangement allows the probe 20 to detect differences between the flux field densities 88 of normal cable 14 spacing 36 and abnormal excessive spacing 78. This process set up allows the cables 14 to be evaluated by the system. The tire 10 that is partially constructed is a brand new tire 10, and not a used carcass or tire that is being subjected to a retread process. Further, the tire 10 that is ultimately build and is thus evaluated by the present process can be a heavy duty truck tire. Although any portion of the partially constructed tire 10 can be evaluated for excessive spacing 78, the portion onto which the belt package 38 is placed may be the part of the partially constructed tire 10 that is evaluated by the present method.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for use in the construction of tires, comprising:
providing a partially constructed tire that is not cured that has a tissue with a plurality of cables that are radial cables of the tire, wherein the plurality of cables extend in a first cable direction and are arranged next to one another in a second cable direction;
providing a probe that has a first magnet, a second magnet, a magnetic bridge, and a spacing hall effect sensor, wherein the probe has a probe first length direction and the first and second magnets are spaced from one another in the probe first length direction, wherein the spacing hall effect sensor is located between the first magnet and the second magnet in the probe first length direction, wherein the probe has a probe second height direction that is perpendicular to the probe first length direction, wherein the spacing hall effect sensor is located between the magnetic bridge and the plurality of cables in the probe second height direction when the probe is positioned next to the partially constructed tire, wherein the probe has a probe third width direction that is perpendicular to the probe first length direction;
positioning the probe next to the partially constructed tire such that the first cable direction is not parallel to the probe first length direction such that the positioning the probe results in an orientation angle between the first cable direction and the probe first length direction that is from 10 degrees to 55 degrees;
moving the probe and the tire relative to one another in the second cable direction; and
sensing spacing between successive ones of the cables of the plurality of cables by use of the probe and the relative movement between the tire and the probe in the second cable direction.

2. The method as set forth in claim 1, wherein the partially constructed tire has a belt package thereon that is located outward of the tissue with the plurality of cables.

3. The method as set forth in claim 1, wherein the partially constructed tire is in a confirmation stage of building.

4. The method as set forth in claim 1, wherein the partially constructed tire is inflated.

5. The method as set forth in claim 1, wherein the tissue with the plurality of cables that are radial cables of the tire is an outermost layer of the partially constructed tire when sensing spacing.

6. The method as set forth in claim 1, wherein the orientation angle is 20 degrees.

7. The method as set forth in claim 1, wherein the spacing hall effect sensor is arranged in a vertical orientation.

8. The method as set forth in claim 1, wherein the probe has a damaged wire hall effect sensor that is located between the first magnet and the second magnet in the probe first length direction, wherein the damaged wire hall effect sensor is located between the magnetic bridge and the plurality of cables in the probe second height direction when the probe is positioned next to the partially constructed tire,
wherein the sensing spacing between successive ones of the cables of the plurality of cables by use of the probe is conducted by obtaining output from the spacing hall effect sensor;
and further comprising sensing broken ones of the cables of the plurality of cables by use of the probe by obtaining output from the damaged wire hall effect sensor.

9. The method as set forth in claim 8, wherein the output from the damaged wire hall effect sensor is used to sense touching between successive ones of the plurality of cables, and wherein the output from the damaged wire hall effect sensor is used to sense crossing cables of the plurality of cables, and wherein the output from the damaged wire hall effect sensor is used to sense damaged cables of the plurality of cables.

10. The method as set forth in claim 8, wherein the spacing hall effect sensor is oriented at a 90 degree angle to the damaged wire hall effect sensor.

11. The method as set forth in claim 8, wherein the damaged wire hall effect sensor is arranged in a horizontal orientation and wherein the spacing hall effect sensor is arranged in a vertical orientation such that the damaged wire hall effect sensor has a greater surface area facing the plurality of cables than does the spacing hall effect sensor.

12. The method as set forth in claim 1, wherein the magnetic bridge engages the first magnet and engages the second magnet and extends completely from the first magnet to the second magnet.

13. The method as set forth in claim 12, wherein a south pole of the first magnet engages the magnetic bridge, and wherein a north pole of the second magnet engages the magnetic bridge.

14. The method as set forth in claim 1, wherein the probe is spaced from the partially constructed tire and is free from engagement with the partially constructed tire, wherein the probe is spaced 3 millimeters from the partially constructed tire.

15. The method as set forth in claim 1, wherein the second cable direction is a circumferential direction, and wherein the moving the probe and the tire relative to one another is created by rotating the tire 360 degrees.

* * * * *